(12) United States Patent
Daibou et al.

(10) Patent No.: US 9,299,918 B2
(45) Date of Patent: Mar. 29, 2016

(54) MAGNETORESISTIVE ELEMENT AND MAGNETIC MEMORY

(71) Applicant: KABUSHIKI KAISHA TOSHIBA, Minato-ku (JP)

(72) Inventors: Tadaomi Daibou, Yokohama (JP); Minoru Amano, Sagamihara (JP); Daisuke Saida, Tokyo (JP); Junichi Ito, Yokohama (JP); Yuichi Ohsawa, Yokohama (JP); Chikayoshi Kamata, Kawasaki (JP); Saori Kashiwada, Yokohama (JP); Hiroaki Yoda, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/504,140

(22) Filed: Oct. 1, 2014

(65) Prior Publication Data

US 2015/0014756 A1    Jan. 15, 2015

Related U.S. Application Data

(62) Division of application No. 13/210,678, filed on Aug. 16, 2011, now Pat. No. 8,878,317.

(30) Foreign Application Priority Data

Mar. 25, 2011  (JP) .................................. 2011-68853

(51) Int. Cl.
*H01L 27/22* (2006.01)
*H01L 43/02* (2006.01)
*H01L 43/08* (2006.01)
*H01L 43/10* (2006.01)
*H01F 10/32* (2006.01)

(52) U.S. Cl.
CPC .............. *H01L 43/02* (2013.01); *H01F 10/329* (2013.01); *H01F 10/3254* (2013.01); *H01F 10/3286* (2013.01); *H01L 27/228* (2013.01); *H01L 43/08* (2013.01); *H01L 43/10* (2013.01); *H01F 10/3272* (2013.01)

(58) Field of Classification Search
None
See application file for complete search history.

(56) References Cited

U.S. PATENT DOCUMENTS

2011/0007560 A1* 1/2011 Dieny et al. .................... 365/171

OTHER PUBLICATIONS

Rachid Sbiaa et al., "Spin Transfer Switching Enhancement in Perpendicular Anisotropy Magnetic Tunnel Junctions with a Canted In-Plane Spin Polarizer", Journal of Applied Physics, vol. 105(1), 2009, pp. 013910-1-013910-6.

(Continued)

*Primary Examiner* — Evan Pert
*Assistant Examiner* — Leslie Pilar Cruz
(74) *Attorney, Agent, or Firm* — Oblon, McClelland, Maier & Neustadt, L.L.P

(57) ABSTRACT

A magnetoresistive element according to an embodiment includes: a first to third ferromagnetic layers, and a first nonmagnetic layer, the first and second ferromagnetic layers each having an axis of easy magnetization in a direction perpendicular to a film plane, the third ferromagnetic layer including a plurality of ferromagnetic oscillators generating rotating magnetic fields of different oscillation frequencies from one another. Spin-polarized electrons are injected into the first ferromagnetic layer and induce precession movements in the plurality of ferromagnetic oscillators of the third ferromagnetic layer by flowing a current between the first and third ferromagnetic layers, the rotating magnetic fields are generated by the precession movements and are applied to the first ferromagnetic layer, and at least one of the rotating magnetic fields assists a magnetization switching in the first ferromagnetic layer.

11 Claims, 8 Drawing Sheets

(56) References Cited

OTHER PUBLICATIONS

Zhitao Diao et al., "Spin Transfer Switching in Dual MgO Magnetic Tunnel Junctions", Applied Physics Letters, vol. 90(13), 2007, pp. 132508-1-132508-3.

Yiming Huai et al., "Spin Transfer Switching Current Reduction in Magnetic Tunnel Junction Based Dual Spin Filter Structures", Applied Physics Letters, vol. 87(22), 2005, pp. 222510-1-222510-3.

W. H. Butler et al., "Spin-Dependent Tunneling Conductance of Fe|MgO|Fe Sandwiches", Physical Review B, vol. 63(5), 2001, pp. 054416-1-054416-12.

* cited by examiner

MAGNETORESISTIVE ELEMENT AND MAGNETIC MEMORY

CROSS-REFERENCE TO RELATED APPLICATION

This application is a divisional of U.S. application Ser. No. 13/210,678 filed Aug. 16, 2011, and is based upon and claims the benefit of priority from prior Japanese Patent Application No. 2011-68853 filed on Mar. 25, 2011 in Japan, the entire contents of each of which are incorporated herein by reference.

FIELD

Embodiments described herein relate generally to a magnetoresistive element and magnetic memory.

BACKGROUND

It is known that a MTJ (Magnetic Tunnel Junction) element serving as a magnetoresistive element has a stacked structure as a basic structure, and shows a tunneling magnetoresistive (TMR) effect. The stacked structure is formed by a first ferromagnetic layer, a tunnel barrier layer, and a second ferromagnetic layer. Such MTJ elements are used in 100 bits per square inch (Mbpsi) HDD heads and magnetic random access memories (MRAMs).

A MRAM characteristically stores information ("1", "0") depending on changes in the relative angle of the magnetizations of magnetic layers included in each MTJ element, and therefore, is nonvolatile. Since a magnetization switching takes only several nanoseconds, high-speed data writing and high-speed data reading can be performed. Therefore, MRAMs are expected to be the next-generation high-speed nonvolatile memories. If a technique called a spin torque transfer switching technique for controlling magnetization through spin-polarized current is used, the current density can be made higher when the cell size of the MRAM is made smaller. Accordingly, high-density, low-power-consumption MRAMs that can readily invert the magnetization of a magnetic material can be formed.

Furthermore, in recent years, attention has been drawn to the theory that a magnetoresistance ratio as high as 1000% can be achieved by using MgO as the tunnel barrier layer. Since the MgO is crystallized, selective tunneling conduction of the electrons having a certain wavenumber from the ferromagnetic layer can be performed, and those electrons can keep the wavenumber during that time. At this point, the spin polarizability has a large value in a certain crystalline orientation, and therefore, a giant magnetoresistive effect appears. Accordingly, an increase in the magnetoresistive effect of each MTJ element leads directly to a higher-density MRAM that consumes less power.

Meanwhile, to form high-density nonvolatile memories, high integration of magnetoresistive elements is essential. However, the ferromagnetic bodies forming magnetoresistive elements have thermal disturbance resistance that is degraded with a decrease in element size. Therefore, how to improve the magnetic anisotropy and thermal disturbance resistance of each ferromagnetic material is a critical issue.

To counter this problem, trial MRAMs using perpendicular-magnetization MTJ elements in which ferromagnetic bodies have magnetization directions perpendicular to the film plane have been made in recent years. In a perpendicular-magnetization MTJ element, a material having high magnetic crystalline anisotropy is normally used for ferromagnetic bodies. Such a material has a magnetization in a certain crystal direction, and the magnetic crystalline anisotropy of the material can be controlled by changing the composition ratio between constituent elements and the crystallinity of the constituent elements. Accordingly, the magnetization direction can be controlled by changing the direction of crystal growth. Also, since ferromagnetic bodies have high magnetic crystalline anisotropy, the aspect ratio of the element can be adjusted. Furthermore, having high thermal disturbance resistance, ferromagnetic bodies are suited for integration. In view of those facts, to realize a highly-integrated MRAM that consumes less power, it is critical to manufacture perpendicular-magnetization MTJ elements that have a great magnetoresistive effect.

To further reduce the current required for performing writing in such a perpendicular-magnetization MTJ element, a magnetization oscillation layer that generates a rotating magnetic field to assist magnetization switching at the time of writing is formed according to a known method.

DETAILED DESCRIPTION

Figure 1:
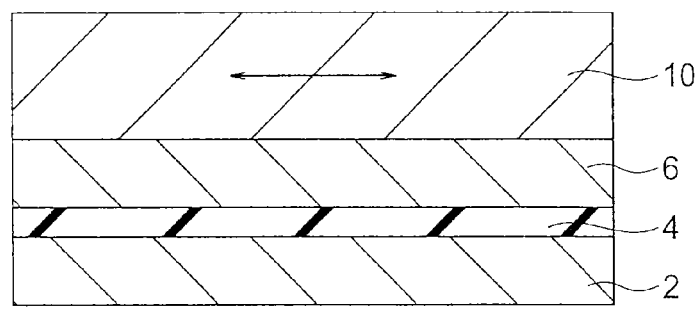
FIG. 1 is a cross-sectional view of a magnetoresistive element according to a first embodiment.

A magnetoresistive element according to an embodiment includes: a first ferromagnetic layer having an axis of easy magnetization in a direction perpendicular to a film plane, a magnetization direction of the first ferromagnetic layer being changeable; a second ferromagnetic layer having an axis of easy magnetization in a direction perpendicular to the film plane, a magnetization direction of the second ferromagnetic layer being fixed; a first nonmagnetic layer formed between the first ferromagnetic layer and the second ferromagnetic layer; and a third ferromagnetic layer formed on an opposite side from the first nonmagnetic layer relative to the second ferromagnetic layer, and including a plurality of ferromagnetic oscillators generating rotating magnetic fields of different oscillation frequencies from one another, each of the oscillators having a magnetization parallel to the film plane.

Spin-polarized electrons are injected into the first ferromagnetic layer and induce precession movements in the plurality of ferromagnetic oscillators of the third ferromagnetic layer by flowing a current between the first ferromagnetic layer and the third ferromagnetic layer, the rotating magnetic fields are generated by the precession movements and are applied to the first ferromagnetic layer, and at least one of the rotating magnetic fields assists a magnetization switching in the first ferromagnetic layer.

The following is a description of embodiments of the present invention, with reference to the accompanying drawings. In the following description, components having the same functions and structures are denoted by the same reference numerals, and description of them will be repeated only where necessary.

First Embodiment

FIG. 1 shows a magnetoresistive element 1 of a first embodiment. FIG. 1 is a cross-sectional view of the magnetoresistive element 1 of the first embodiment. The magnetoresistive element 1 of this embodiment is a MTJ element and has a structure that is formed by stacking a ferromagnetic layer 2, a nonmagnetic layer (also called a tunnel barrier layer) 4, a ferromagnetic layer 6, and a magnetization oscillation layer 10 in this order. The ferromagnetic layers 2 and 6 each has an easy magnetization direction perpendicular to the film plane. That is, the MTJ element of this embodiment is a so-called perpendicular-magnetization MTJ element in which the ferromagnetic layers 2 and 6 each has a magnetization direction perpendicular to the film plane. It should be noted that, in this specification, "film plane" refers to the upper surface of each ferromagnetic layer. Also, "easy magnetization direction" is the direction in which a macro-size ferromagnetic material has the lowest internal energy when the spontaneous magnetization direction of the macro-size ferromagnetic material is the same as the direction in a situation where there is no external magnetic fields. On the other hand, "hard magnetization direction" is the direction in which a macro-size ferromagnetic material has the largest internal energy when the spontaneous magnetization direction of the macro-size ferromagnetic material is the same as the direction in a situation where there are no external magnetic fields. When a write current flows into the MTJ element 1, the magnetization direction of one of the ferromagnetic layer 2 and the ferromagnetic layer 6 does not change (or is fixed), and the magnetization direction of the other ferromagnetic layer is changeable. The ferromagnetic layer having a fixed magnetization direction is also referred to as a reference layer, and the ferromagnetic layer having a changeable magnetization direction is also referred to as a storage layer.

The magnetization oscillation layer 10 includes magnetic materials (oscillators) that have magnetization directions parallel to the film plane. The frequencies of rotating magnetic fields generated from the respective magnetic materials (oscillation frequencies) differ from one another. When a current flowing in a direction perpendicular to the film plane is applied to the magnetization oscillation layer 10, the magnetization precesses in the film plane or rotates, to generate a rotating magnetic field. The frequency of the rotating magnetic field is determined by the magnetic parameters of the magnetization oscillation layer 10 and the applied current density. The frequency of the rotating magnetic field is designed to be within the range including the resonant frequency of the storage layer. When the frequency of the rotating magnetic field generated from the magnetization of the magnetization oscillation layer 10 matches the resonant frequency observed when the magnetization of the ferromagnetic layer 2 serving as the storage layer is reversed, the magnetization switching in the ferromagnetic layer 2 serving as the storage layer can be assisted, or the magnetization switching current in the ferromagnetic layer 2 can be reduced.

Figure 2:
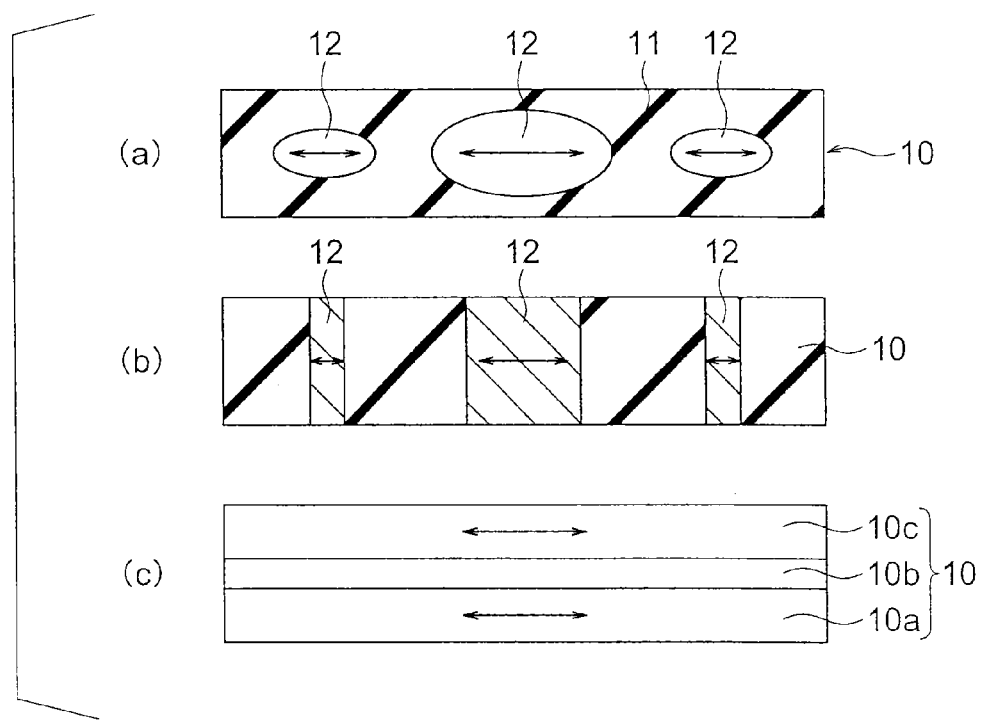
FIGS. 2(a) through 2(c) are cross-sectional views of specific examples of magnetization oscillation layers.

A first specific example of the magnetization oscillation layer 10 has a granular film structure in which magnetic fine grains 12 of different sizes of several tends of nanometers are scattered in a nonmagnetic material 11 such as AlO, as shown in FIG. 2(a). The respective magnetic fine grains 12 have magnetizations parallel to the film plane. The respective magnetic fine grains 12 have a size (diameter) or magnetic parameter distribution, and therefore, the magnetizations of the respective fine grains 12 rotate at different frequencies from one another. Accordingly, the magnetization oscillation layer 10 as an aggregate of the magnetic fine grains 12 oscillates at an oscillation frequency having a distribution. That is, the effect to assist magnetization switching in the storage layer can be achieved in a wide current range. If the magnetization oscillation layer 10 of the first specific example shown in FIG. 2(a) is used, a nonmagnetic layer is preferably provided between the magnetization oscillation layer 10 and the ferromagnetic layer 6.

A second specific example of the magnetization oscillation layer 10 may be a structure in which magnetic materials 12 that penetrate through an insulator 11 and have different sizes (diameters) are formed in the insulator 11, as shown in FIG. 2(b). In this case, the effect to assist magnetization switching in the storage layer can be achieved in a wide current range, as in the first specific example. If the magnetic oscillation layer 10 of the second specific example shown in FIG. 2(b) is used, a nonmagnetic layer is preferably provided between the magnetization oscillation layer 10 and the ferromagnetic layer 6.

In a third specific example, the magnetization oscillation layer 10 has a stacked structure formed with ferromagnetic films and a nonmagnetic film. For example, a ferromagnetic film 10a, a nonmagnetic film 10b, and a ferromagnetic film 10c are stacked in this order to form the stacked structure, as shown in FIG. 2(c). The respective ferromagnetic films 10a and 10c have different oscillation frequencies from each other, and the oscillation frequencies are set in a region near the resonant frequency of the storage layer. That is, in this case, the effect to assist magnetization switching in the storage layer can also be achieved in a wide current range. If the magnetic oscillation layer 10 of the third specific example shown in FIG. 2(c) is used, a nonmagnetic layer is preferably provided between the magnetization oscillation layer 10 and the ferromagnetic layer 6. In FIG. 2(c), two ferromagnetic films having a nonmagnetic film interposed in between are shown, but three or more ferromagnetic films may be provided.

Next, an operation to be performed by the magnetoresistive element 1 of this embodiment at the time of writing is described. A write current flowing in a direction perpendicular to the film plane is applied between the ferromagnetic layer 2 and the ferromagnetic layer 6. It should be noted that, in this description of the operation, the ferromagnetic layer 2 serves as the storage layer, and the ferromagnetic layer 6 serves as the reference layer.

First, in a case where the magnetization direction of the ferromagnetic layer 2 and the magnetization direction of the ferromagnetic layer 6 are antiparallel (or the opposite directions from each other), a current is applied from the ferromagnetic layer 2 to the magnetization oscillation layer 10 via the nonmagnetic layer 4 and the ferromagnetic layer 6. In this case, electrons flow from the magnetization oscillation layer 10 to the ferromagnetic layer 2 via the ferromagnetic layer 6 and the nonmagnetic layer 4. The electrons that are spin-polarized through the ferromagnetic layer 6 flow into the ferromagnetic layer 2. The spin-polarized electrons having spins in the same direction as the magnetization direction of the ferromagnetic layer 2 pass through the ferromagnetic layer 2. However, the spin-polarized electrons having spins in the opposite direction from the magnetization direction of the ferromagnetic layer 2 apply a spin torque to the magnetization of the ferromagnetic layer 2, so that the magnetization direction of the ferromagnetic layer 2 becomes the same as the magnetization direction of the ferromagnetic layer 6. At this point, the magnetization oscillation layer 10 generates a rotating magnetic field having a frequency within a range including the resonant frequency of the ferromagnetic layer 2 serving as the storage layer, and a rotating magnetic field parallel to the film plane is applied to the ferromagnetic layer 2. That is, a magnetization switching in the ferromagnetic layer 2 serving as the storage layer is assisted. As a result of this, the magnetization direction of the ferromagnetic layer 2 is reversed, and becomes parallel to (or the same as) the magnetization direction of the ferromagnetic layer 6.

In a case where the magnetization direction of the ferromagnetic layer 2 and the magnetization direction of the ferromagnetic layer 6 are parallel, a write current is applied from the magnetization oscillation layer 10 to the ferromagnetic layer 2 via the ferromagnetic layer 6 and the nonmagnetic layer 4. In this case, electrons flow from the ferromagnetic layer 2 to the magnetization oscillation layer 10 via the nonmagnetic layer 4 and the ferromagnetic layer 6. As a result, the electrons that are spin-polarized through the ferromagnetic layer 2 flow into the ferromagnetic layer 6. The spin-polarized electrons having spins in the same direction as the magnetization direction of the ferromagnetic layer 6 pass through the ferromagnetic layer 6. However, the spin-polarized electrons having spins in the opposite direction from the magnetization direction of the ferromagnetic layer 6 are reflected by the interface between the nonmagnetic layer 4 and the ferromagnetic layer 6, flow into the ferromagnetic layer 2 through the nonmagnetic layer 4, and apply a spin torque to the magnetization of the ferromagnetic layer 2, so that the magnetization direction of the ferromagnetic layer 2 becomes the opposite from the magnetization direction of the ferromagnetic layer 6. At this point, the magnetization oscillation layer 10 generates a rotating magnetic field having a frequency within a range including the resonant frequency of the ferromagnetic layer 2 serving as the storage layer, and a rotating magnetic field parallel to the film plane is applied to the ferromagnetic layer 2. That is, a magnetization switching in the ferromagnetic layer 2 serving as the storage layer is assisted. As a result of this, the magnetization direction of the ferromagnetic layer 2 is reversed, and becomes antiparallel to the magnetization direction of the ferromagnetic layer 6.

Figure 3:
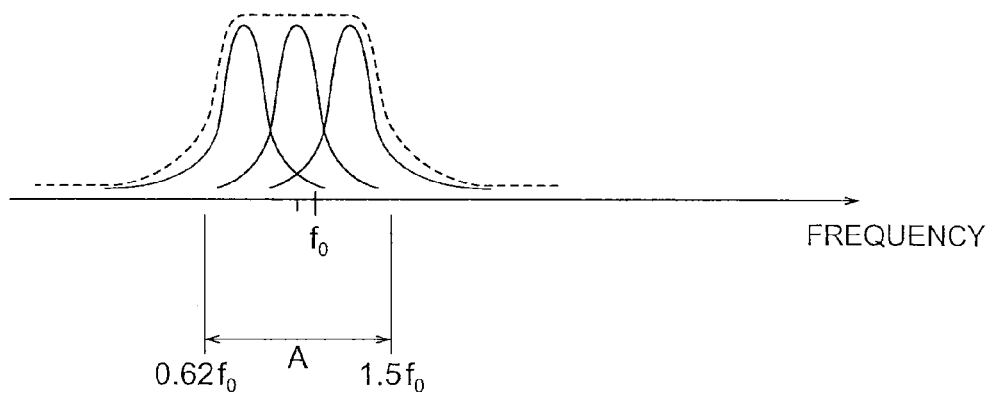
FIG. 3 is a diagram showing the resonant frequency characteristics of the magnetization oscillation layer.

As shown in FIG. 3, in the first embodiment, the magnetization oscillation layer 10 has the different oscillation frequency characteristics indicated by the solid lines in the range A including the resonant frequency $f_0$ of the ferromagnetic layer 2 serving as the storage layer. Accordingly, the oscillation frequency characteristics of the magnetization oscillation layer 10 has characteristics combining the different oscillation frequency characteristics indicated by the solid lines, or have the wide oscillation frequency band indicated by the broken line. As the magnetization oscillation layer 10 has such a wide oscillation frequency band and has an oscillation frequency proportional to the current density as described later, the magnetization oscillation layer 10 resonates with a wide range of current values, and the write current can be reduced. If the frequency of the rotating magnetic field generated from the magnetization oscillation layer 10 is in the range of 2.5 GHz to 6.0 GHz, the preferred range A including the resonant frequency $f_0$ of the ferromagnetic layer 2 serving as the storage layer is the range of $0.62f_0$ to $1.50f_0$ with respect to the resonant frequency $f_0$ of the ferromagnetic layer 2 serving as the storage layer. In this range ($0.62f_0$ to $1.50f_0$), an assisting effect for the storage layer is achieved, as disclosed in the specification of another application (JP-A 2009-231753(KOKAI)) filed by the applicant. Therefore, the magnetization oscillation layer 10 preferably generates an oscillation frequency in the range of $0.62f_0$ to $1.50f_0$ with respect to the resonant frequency $f_0$ of the ferromagnetic layer 2 serving as the storage layer.

As described above, according to the first embodiment, the write current range can be made wider, and the write current can be made smaller.

Even if the resonant frequency of the ferromagnetic layer 2 serving as the storage layer varies or fluctuates, or even if the oscillation frequency of the magnetization oscillation layer 10 varies or fluctuates, the natural frequency of the storage layer can fall within the oscillation frequency band of the magnetization oscillation layer 10. As a result, highly-efficient spin-injection writing using resonance can be stably performed.

(Modification)

Figure 4:
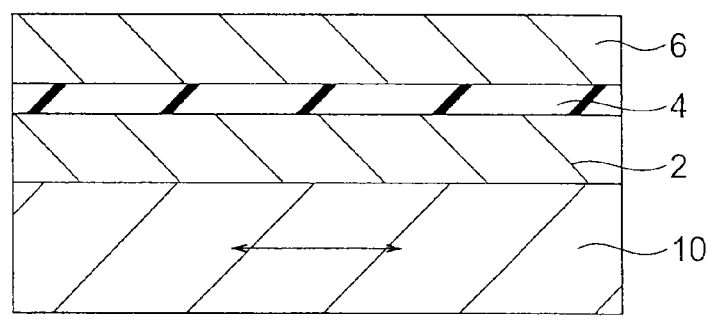
FIG. 4 is a cross-sectional view of a magnetoresistive element according to a modification of the first embodiment.

FIG. 4 shows a magnetoresistive element according to a modification of the first embodiment. The magnetoresistive element 1A of this modification is the same as the magnetoresistive element of the first embodiment shown in FIG. 1, except that the magnetization oscillation layer 10 is provided on the opposite side of the ferromagnetic layer 2 serving as the storage layer from the nonmagnetic layer 4.

In this modification, the write current range can be made wider, and the write current can be made smaller, as in the first embodiment. Also, highly-efficient spin-injection writing can be stably performed.

Second Embodiment

Figure 5:
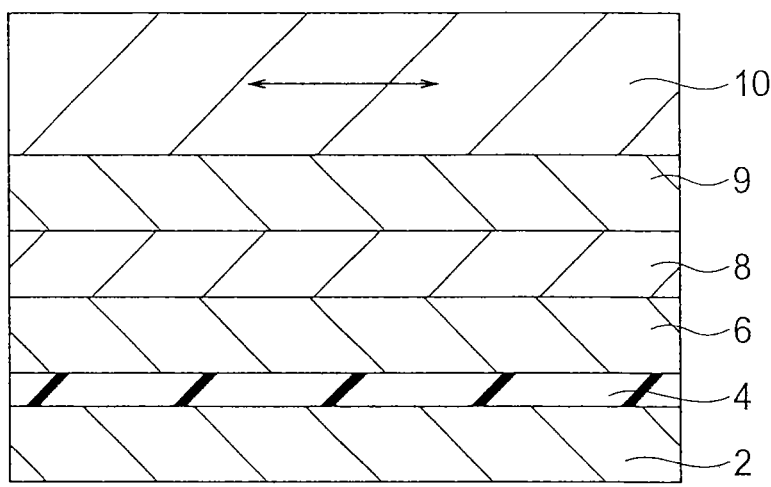
FIG. 5 is a cross-sectional view of a magnetoresistive element according to a second embodiment.

FIG. 5 shows a magnetoresistive element according to a second embodiment. The magnetoresistive element 1B of the second embodiment is the same as the magnetoresistive element 1 of the first embodiment shown in FIG. 1, except that a nonmagnetic layer 8 and a ferromagnetic layer 9 are provided between the ferromagnetic layer 6 and the magnetization oscillation layer 10. The ferromagnetic layer 9 is also called a bias layer, and absorbs and adjusts a shift in the switching current for the magnetization reversal of the ferromagnetic layer 2 serving as the storage layer due to a leak magnetic field generated from the ferromagnetic layer 6 serving as the reference layer. The magnetization direction of the ferromagnetic layer 9 is preferably antiparallel to (or the opposite of) the magnetization direction of the ferromagnetic layer 6. Also, the ferromagnetic layer 9 may be antiferromagnetically coupled to the ferromagnetic layer 6 via the nonmagnetic layer 8 (Synthetic Anti-Ferromagnetic (SAF) coupling).

The nonmagnetic layer 8 preferably has the adequate thermal stability so that the ferromagnetic layer 6 and the ferromagnetic layer 9 do not mix with each other in a heating process. The nonmagnetic layer 8 also preferably has a function to control the crystalline orientation when the ferromagnetic layer 9 is formed. Further, if the nonmagnetic layer 8 is thick, the distance between the ferromagnetic layer 9 and the ferromagnetic layer 2 serving as the storage layer is long, and the shift adjusting magnetic field to be applied from the ferromagnetic layer 9 to the storage layer is small. Therefore, the film thickness of the nonmagnetic layer 8 is preferably 5 nm or smaller. The ferromagnetic layer 9 is made of a ferromagnetic material that has an easy axis of magnetization in a direction perpendicular to the film plane. Since the ferromagnetic layer 9 is further away from the ferromagnetic layer 2 serving as the storage layer than the ferromagnetic layer 6 serving as the reference layer is, the film thickness or the saturation magnetization $M_S$ of the ferromagnetic layer 9 need to be greater than those of the reference layer so that the ferromagnetic layer 9 adjusts the leak magnetic field to be applied to the storage layer. That is, according to the results of the study made by the inventors, where $t_2$ and $M_{S2}$ represent the film thickness and saturation magnetization of the ferromagnetic layer 6 serving as the reference layer, and $t_4$ and $M_{S4}$ represent the film thickness and saturation magnetization of the ferromagnetic layer 9, the following relational expression should be satisfied:

$$M_{S2} \times t_2 < M_{S4} \times t_4$$

In the second embodiment, the write current range can be made wider, and the write current can be made smaller, as in the first embodiment. Also, highly-efficient spin-injection writing can be stably performed.

It should be noted that each spin injection layer 7 used in the later described third embodiment and its modifications and in the later described fourth embodiment can be made to function as a bias layer by appropriately selecting the film thickness and saturation magnetization.

Third Embodiment

Figure 6:
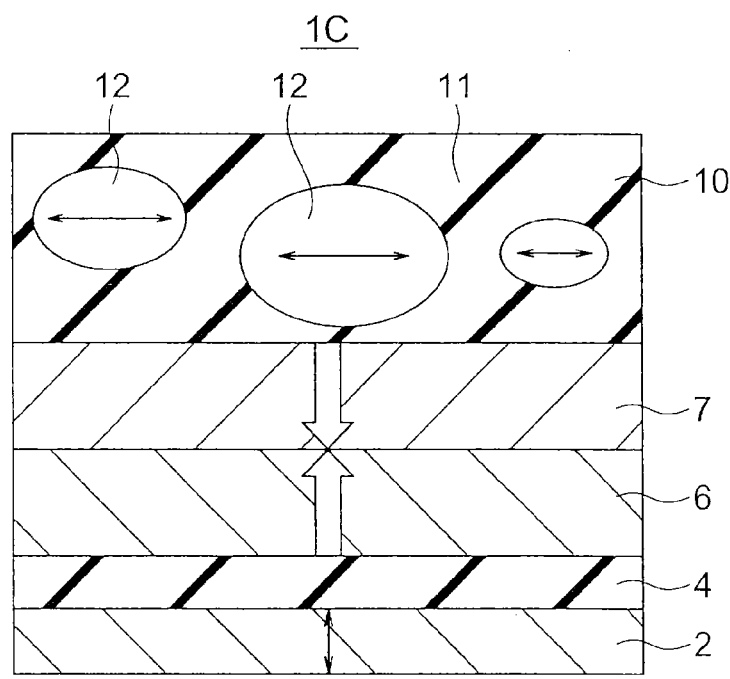
FIG. 6 is a cross-sectional view of a magnetoresistive element according to a third embodiment.

FIG. 6 shows a magnetoresistive element according to a third embodiment. The magnetoresistive element 1C of the third embodiment is the same as the magnetoresistive element 1 of the first embodiment shown in FIG. 1, except that a spin injection layer 7 having a magnetization direction antiparallel to the magnetization of the ferromagnetic layer 6 is provided between the ferromagnetic layer 6 and the magnetization oscillation layer 10, and the magnetization oscillation layer 10 has the granular film structure shown in FIG. 2(a). That is, the magnetization oscillation layer 10 has ferromagnetic grains 12 surrounded by a nonmagnetic matrix 11. The ferromagnetic grains 12 are magnetically independent of one another. When a current flowing in a direction substantially perpendicular to the film plane is applied, spin-polarized electrons are injected from the spin injection layer 7 into the magnetization oscillation layer 10. As a result, the respective ferromagnetic grains 12 oscillate to generate a high-frequency rotating magnetic field. In this manner, highly-efficient spin-injection writing can be performed. The oscillation frequencies of the ferromagnetic grains differ from one another, and there exists at least one combination of two ferromagnetic grains having oscillation frequencies that differ from each other by 20 to 50%. The size of the magnetoresistive element 1B is approximately 30 nm in diameter, and the number of ferromagnetic grains 12 contained in the magnetoresistive element 1B is 2 to 10. The thicknesses of the ferromagnetic grains 12 vary from 1 nm to 3 nm, the diameters vary from 3 nm to 12 nm, and the largest volume is approximately 50 times greater than the smallest volume.

Each oscillation frequency fi at the time of spin injection from the spin injection layer 7 into the magnetization oscillation layer 10 is expressed by the following mathematical formula obtained by solving the Landau-Lifshitz-Gilbert (LLG) equation:

$$f_i = \frac{\gamma}{2\pi\alpha}\left(\frac{\hbar}{2e}\right)\frac{g(\theta)}{M_S t} J \quad (1)$$

However, if the nonmagnetic matrix 11 of the magnetization oscillation layer 10 is a metal, the following relationship is satisfied:

$$g(\theta) = \left[\frac{-4 + (1+P)^3(3+\cos\theta)}{4P^{3/2}}\right]^{-1} \quad (2)$$

If the nonmagnetic matrix 11 of the magnetization oscillation layer 10 is an insulator, the following relationship is satisfied:

$$g(\theta) = \frac{1}{2}\frac{P}{1+P^2\cos\theta} \quad (3)$$

Here, $\gamma$ represents the gyromagnetic constant, $\alpha$ represents the damping constant, P represents the polarization, $M_S$ represents the saturation magnetization, t represents the thickness of the oscillator grains 12 of the magnetization oscillation layer 10, J represents the density of current flowing in the magnetization oscillation layer 10, h-bar represents the Dirac constant obtained by dividing the Planck constant h by $2\pi$, and e represents the elementary charge. Further, $\theta$ represents the relative angle between the magnetization of the magnetization oscillation layer 10 and the magnetization of the spin injection layer 7 under oscillating conditions.

Therefore, if the damping constants, the saturation magnetizations, the volumes, the spin injection efficiencies, and the injection currents of the oscillators of the magnetization oscillation layer 10 vary, the oscillation frequencies of the oscillators also vary.

According to the mathematical formula (1), the oscillation frequency fi is proportional to the product of $g(\theta)$ and the current density J, and is inversely proportional to the film thickness t of the magnetization oscillation layer 10. Therefore, when a uniform current flows in the magnetization oscillation layer 10, the oscillation frequency fi does not depend on the area even if the largest area is ten times larger than the smallest area, and depends on the thickness t of the ferromagnetic grain 12 and $g(\theta)$. Furthermore, in a case where the thicknesses t of all the ferromagnetic grains 12 are uniform, the oscillation frequency fi depends only on $g(\theta)$, and ultimately, the oscillation frequency fi is determined by $\theta$, which is determined by the demagnetizing field in accordance with the shape of the ferromagnetic grain 12.

In this embodiment, the nonmagnetic matrix 11 may be an insulating material such as AlOx or MgO, or a metal material such as Cu, Ag, or Au. In a case where an insulating material is used, oscillation is caused by spin injection using a TMR effect. In a case where a metal material is used, oscillation is caused by spin injection using a GMR effect.

As described above, in the third embodiment, the write current range can be made wider, and the write current can be made smaller, as in the first embodiment. Also, even if the resonant frequency of the ferromagnetic layer 2 serving as the storage layer varies or fluctuates, or even if the oscillation frequency of the magnetization oscillation layer 10 varies or fluctuates, the resonant frequency of the storage layer can fall within the oscillation frequency band of the magnetization oscillation layer 10. As a result, highly-efficient spin-injection writing using resonance can be stably performed.

(First Modification)

Figure 7A:
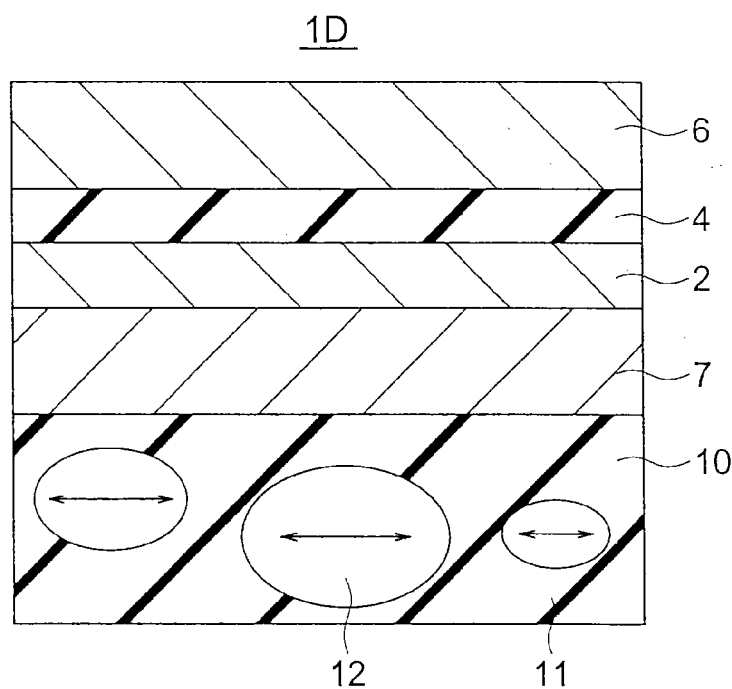
FIG. 7A is a cross-sectional view of a magnetoresistive element according to a first modification of the third embodiment.

FIG. 7A shows a magnetoresistive element according to a first modification of the third embodiment. The magnetoresistive element 1D of the first modification is the same as the magnetoresistive element 1C of the third embodiment shown in FIG. 6, except that the spin injection layer 7 and the magnetization oscillation layer 10 are provided on the opposite side of the ferromagnetic layer 2 serving as the storage layer from the nonmagnetic layer 4. In the first modification, the spin injection layer 7 is interposed between the ferromagnetic layer 2 and the magnetization oscillation layer 10.

(Second Modification)

Figure 7B:
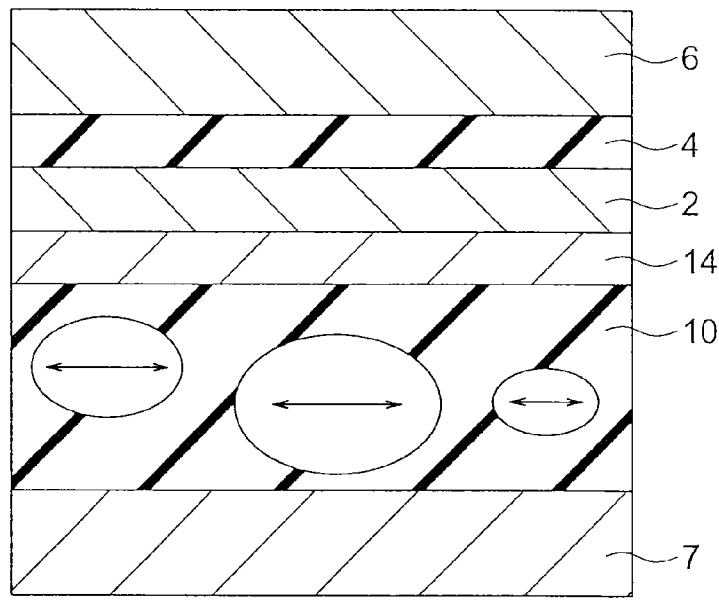
FIG. 7B is a cross-sectional view of a magnetoresistive element according to a second modification of the third embodiment.

FIG. 7B shows a magnetoresistive element according to a second modification of the third embodiment. The magnetoresistive element $1D_1$ of the second modification is the same as the magnetoresistive element 1D of the first modification shown in FIG. 7A, except that the positions of the spin injection layer 7 and the magnetization oscillation layer 10 are reversed. That is, the spin injection layer 7 is provided on the opposite side of the magnetization oscillation layer 10 from the ferromagnetic layer 2. In the second modification, a nonmagnetic layer 14 is preferably inserted between the ferromagnetic layer 2 and the magnetization oscillation layer 10 so that spin-polarized electrons do not move between the ferromagnetic layer 2 and the magnetization oscillation layer 10. The nonmagnetic layer 14 should be made of a material having a small spin diffusion length. In the second modification, the magnetization oscillation layer 10 is located close to the ferromagnetic layer 2 serving as the storage layer, and accordingly, the magnetization oscillation layer 10 can more effectively assist magnetization switching in the ferromagnetic layer 2.

Also, in the second modification, the bias layer 9 described in the second embodiment may be provided on the opposite side of the ferromagnetic layer 6 from the nonmagnetic layer 4. In such a case, the nonmagnetic layer 8 is preferably interposed between the ferromagnetic layer 6 and the bias layer 9 as in the second embodiment. By providing the bias layer 9, a shift in the switching current for the magnetization reversal of the ferromagnetic layer 2 serving as the storage layer can be absorbed and adjusted.

(Third Modification)

Figure 7C:
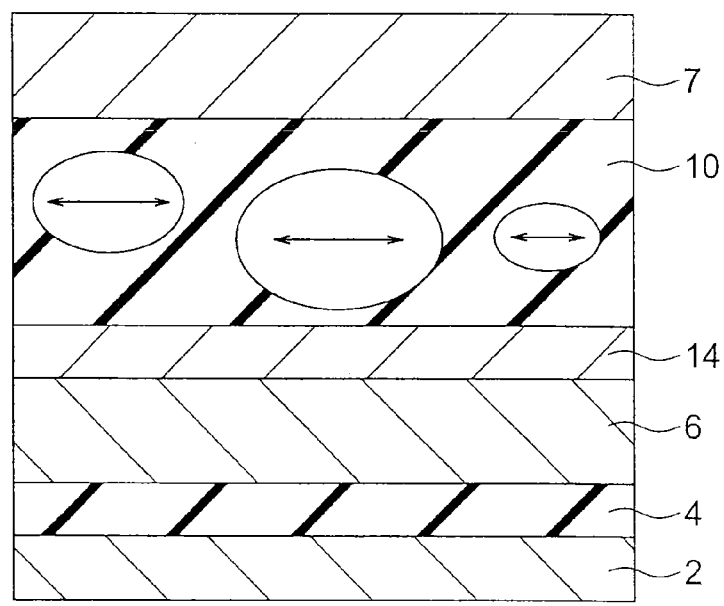
FIG. 7C is a cross-sectional view of a magnetoresistive element according to a third modification of the third embodiment.

FIG. 7C shows a magnetoresistive element according to a third modification of the third embodiment. The magnetoresistive element $1D_2$ of the third modification is the same as the magnetoresistive element 1C of the third embodiment shown in FIG. 6, except that the positions of the spin injection layer 7 and the magnetization oscillation layer 10 are reversed. That is, the spin injection layer 7 is provided on the opposite side of the magnetization oscillation layer 10 from the ferromagnetic layer 6. In the third modification, the nonmagnetic layer 14 is preferably inserted between the ferromagnetic layer 6 and the magnetization oscillation layer 10 as in the second modification.

In the above described first through third modifications, the write current range can be made wider, and the write current can be made smaller as in the third embodiment. Also, highly-efficient spin-injection writing can be stably performed.

Fourth Embodiment

Figure 8:
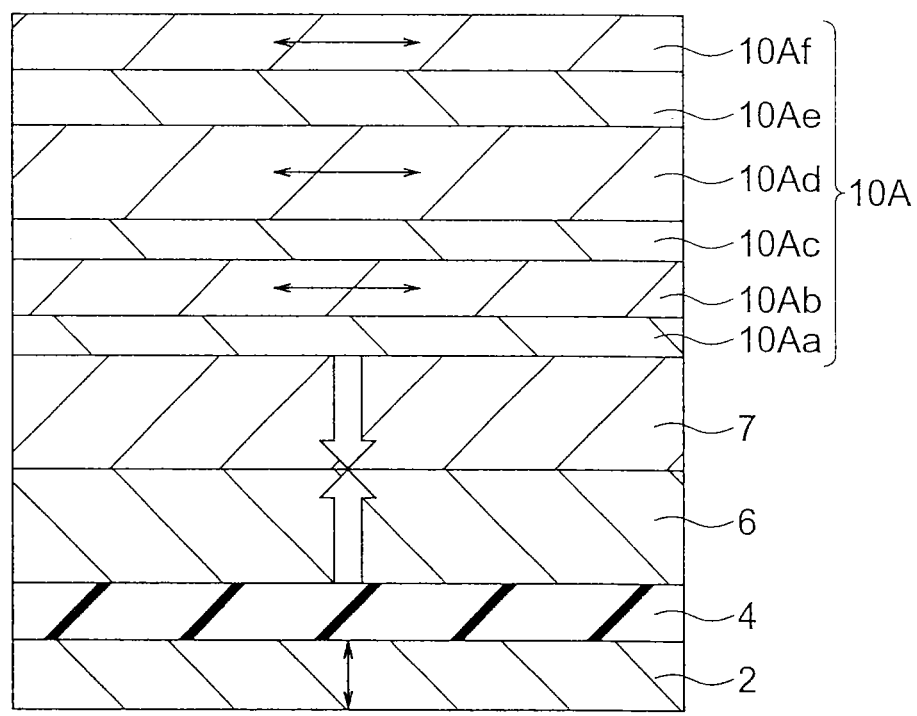
FIG. 8 is a cross-sectional view of a magnetoresistive element according to a fourth embodiment.

FIG. 8 shows a magnetoresistive element of a fourth embodiment. The magnetoresistive element 1E of the fourth embodiment is the same as the magnetoresistive element 1C of the third embodiment shown in FIG. 6, except that the magnetization oscillation layer 10 is replaced with a magnetization oscillation layer 10A having a stacked structure in which ferromagnetic films and nonmagnetic films are stacked. The magnetization oscillation layer 10A has a structure formed by stacking a nonmagnetic film 10Aa, a ferromagnetic film 10Ab, a nonmagnetic film 10Ac, a ferromagnetic film 10Ad, a nonmagnetic film 10Ae, and a ferromagnetic film 10Af in this order on the spin injection layer 7. Those ferromagnetic films 10Ab, 10Ad, and 10Af are magnetically independent of one another, and are not coupled to one another.

The ferromagnetic films 10Ab, 10Ad, and 10Af differ in film thickness or material. For example, three ferromagnetic films (such as CoFe films) having film thicknesses of 2 nm, 2.5 nm, and 3 nm are stacked, with 2-nm thick Cu films being interposed between the ferromagnetic films. The ratio between the maximum oscillation frequency and the minimum oscillation frequency is 1.5. To perform high-efficiency writing with resonance, oscillation should be caused at a frequency of $0.62f_0$ to $1.50f_0$ with respect to the resonant frequency $f_0$ of the storage layer. Therefore, if oscillation is caused at two frequencies of 4 GHz and 6 GHz, a desired effect can be achieved in a wide $f_0$ range of 2.7 to 10 GHz.

In the fourth embodiment, the write current range can be made wider, and the write current can be made smaller, as in the third embodiment. Also, highly-efficient spin-injection writing can be stably performed.

In the following, the structures of respective layers in the MTJ elements 1, 1A, 1B, 1C, 1D, $1D_1$, $1D_2$, and 1E of the first through fourth embodiments and their modifications are specifically described. The ferromagnetic layer 2, the ferromagnetic layer 6, the spin injection layer 7, the magnetization oscillation layer 10, and the nonmagnetic layer 4 are described in this order.

(Ferromagnetic Layer 2)

The ferromagnetic layer 2 has an easy axis of magnetization in a direction perpendicular to the film plane. The material used as the ferromagnetic layer 2 can be a metal that has (111) crystalline orientation of a face-centered cubic (FCC) structure or has (001) crystalline orientation of a hexagonal close-packed (HCP) structure, or a metal that can form an artificial lattice, for example. An example of the metal that has the (111) crystalline orientation of a FCC structure or the (001) crystalline orientation of a HCP structure is an alloy containing at least one element selected from the first group consisting of Fe, Co, Ni, and Cu, and at least one element selected from the second group consisting of Pt, Pd, Rh, and Au. Specifically, the metal is a ferromagnetic alloy such as CoPd, CoPt, NiCo, or NiPt.

The artificial lattice used in the ferromagnetic layer 2 can be a structure in which one element of Fe, Co, and Ni or an alloy containing the one element (a ferromagnetic film), and one element of Cr, Pt, Pd, Ir, Rh, Ru, Os, Re, Au, and Cu or an alloy containing the one element (a nonmagnetic film) are alternately stacked. For example, the artificial lattice can be a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice. In each of the artificial lattices, the magnetic anisotropic energy density and saturation magnetization can be controlled by adjusting the addition of an element to the ferromagnetic film and the film thickness ratio between the ferromagnetic film and the nonmagnetic film.

(Ferromagnetic Layer 6)

The ferromagnetic layer 6 has an easy axis of magnetization in a direction perpendicular to the film plane. The material used as the ferromagnetic layer 6 can be a metal that has (111) crystalline orientation of a face-centered cubic (FCC) structure or has (001) crystalline orientation of a hexagonal close-packed (HCP) structure, or a metal that can form an artificial lattice, for example. An example of the metal that has the (111) crystalline orientation of a FCC structure or the (001) crystalline orientation of a HCP structure is an alloy containing at least one element selected from the first group consisting of Fe, Co, Ni, and Cu, and at least one element selected from the second group consisting of Pt, Pd, Rh, and Au. Specifically, the metal is a ferromagnetic alloy such as CoPd, CoPt, NiCo, or NiPt.

The artificial lattice used in the ferromagnetic layer 6 can be a structure in which one element of Fe, Co, and Ni or an alloy containing the one element (a ferromagnetic film), and one element of Cr, Pt, Pd, Ir, Rh, Ru, Os, Re, Au, and Cu or an alloy containing the one element (a nonmagnetic film) are alternately stacked. For example, the artificial lattice can be a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice. In each of the artificial lattices, the magnetic anisotropic energy density and saturation magnetization can be controlled by adjusting the addition of an element to the ferromagnetic film and the film thickness ratio between the ferromagnetic film and the nonmagnetic film.

Also, the material used as the ferromagnetic layer 6 can be an alloy containing at least one element selected from the group consisting of transition metals Fe, Co, and Ni, and at least one element selected from the group consisting of rare-earth metals Tb, Dy, and Gd. For example, the material can be TbFe, TbCo, TbFeCo, DyTbFeCo, or GdTbCo. Alternatively, the material can be a multilayer structure formed by alternately stacking those alloys. Specifically, such a multilayer structure can be a multilayer film such as a TbFe/Co film, a TbCo/Fe film, a TbFeCo/CoFe film, a DyFe/Co film, a DyCo/Fe film, or a DyFeCo/CoFe film. In each of those alloys, the magnetic anisotropy energy density and saturation magnetization can be controlled by adjusting the film thickness ratio and the composition.

The material used as the ferromagnetic layer 6 can also be an alloy containing at least one element selected from the first group consisting of Fe, Co, Ni, and Cu, and at least one element selected from the second group consisting of Pt, Pd, Rh, and Au. Specifically, the material can be a ferromagnetic alloy such as FeRh, FePt, FePd, or CoPt.

(Spin Injection Layer 7)

As the spin injection layer 7, the same material as the ferromagnetic layer 6 can be used.

(Magnetization Oscillation Layer 10)

The magnetization oscillation layer 10 has nanometer-size metal ferromagnetic granules scattered in a nonmagnetic matrix. In a case where the nonmagnetic matrix is an insulator, the material of the nonmagnetic matrix is an oxide, a nitride, or a carbide containing at least one element selected from Al, Si, Ti, Mg, Ta, Zn, Fe, Co, and Ni, and the ferromagnetic fine grains contain at least one element selected from Fe, Co, and Ni. In a case where the nonmagnetic matrix is a conductor, the material of the nonmagnetic matrix can be a nonmagnetic metal material such as Cu, Ag, or Au. In this case, the ferromagnetic fine grains also contain at least one element selected from Fe, Co, and Ni.

In a case where the magnetization oscillation layer 10 has a stacked structure formed by stacking ferromagnetic films and nonmagnetic films, the ferromagnetic films contain at least one element selected from Fe, Co, and Ni, and the nonmagnetic films contain at least one element selected from Cu, Ag, Au, and Ru.

(Nonmagnetic Layer 4)

The nonmagnetic layer 4 is made of an insulating material, and therefore, a tunnel barrier layer is used as the nonmagnetic layer 4. The tunnel barrier layer material can be an oxide having a main component that is one element selected from the group consisting of magnesium (Mg), calcium (Ca), barium (Ba), aluminum (Al), beryllium (Be), strontium (Sr), and titanium (Ti). Specifically, the tunnel barrier layer material can be MgO, CaO, BaO, AlO, BeO, SrO, or TiO. The tunnel barrier layer can be a mixed crystalline material containing two or more materials selected from the above-mentioned oxide group. Examples of mixed crystalline materials include MgAlO, MgTiO, and CaTiO.

The tunnel barrier layer can be either a crystalline material or an amorphous material. If the tunnel barrier layer is a crystalline layer, however, electron scattering can be restrained in the tunnel barrier, and the probability of selective tunneling conduction of electrons from the ferromagnetic layer while wavenumber is kept becomes higher. Accordingly, the magnetoresistance ratio can be made higher.

To increase the magnetoresistance ratio of the magnetoresistive element, an interfacial layer made of a material having a high spin polarizability is preferably provided adjacent to the tunnel barrier layer of the nonmagnetic layer 4 made of MgO. The interfacial layer is preferably made of an alloy containing at least one metal selected from the group consisting of Fe and Co, for example. Also, to control the saturation magnetization, at least one element selected from the group consisting of Ni, B, C, P, Ta, Ti, Mo, Si, W, Nb, Mn, and Ge can be added as the interfacial layer. That is, the interfacial layer is an alloy containing at least one element selected from the group consisting of Fe and Co, and at least one element selected from the group consisting of Ni, B, C, P, Ta, Ti, Mo, Si, W, Nb, Mn, and Ge. For example, the alloy can be CoFeB, but can also be CoFeSi, CoFeP, CoFeW, or CoFeNb. Those alloys have the same spin polarizability as that of CoFeB. Alternatively, the interfacial layer can be a Heusler metal such as $Co_2FeSi$, $Co_2MnSi$, or $Co_2MnGe$. A Heusler metal has a spin polarizability equal to or higher than that of CoFeB, and therefore, is suited to be the interfacial layer. If an interfacial layer made of CoFe, a nonmagnetic layer made of MgO, and an interfacial layer made of CoFe are formed, for example, the epitaxial relationship of CoFe (001)/MgO (001)/CoFe (001) can be formed. In this case, the wavenumber selectivity of the tunneling electrons can be improved, and accordingly, a higher magnetoresistance ratio can be achieved.

Fifth Embodiment

The MTJ elements 1, 1A, 1B, 1C, 1D, and 1E of the first through fourth embodiments and their modifications can be applied to MRAMs. In the following, for ease of description, an example case where the MTJ element 1 of the first embodiment is used is described.

Each memory element forming a MRAM includes a storage layer that has a variable (or reversible) magnetization (or spin) direction, a reference layer that has an invariable (or fixed) magnetization direction, and a nonmagnetic layer interposed between the storage layer and the reference layer. Where "the magnetization direction of the reference layer is invariable", the magnetization direction of the reference layer does not change when the magnetization reversing current to be used for switching the magnetization direction of the storage layer is applied to the reference layer. Since the two ferromagnetic layers each having an easy axis of magnetization in a direction perpendicular to the film plane serve as the storage layer and the reference layer, a MRAM including MTJ elements as memory elements can be formed.

Specifically, the two ferromagnetic layers are made to have a difference in coercive force from each other, so that the two ferromagnetic layers can be used as the storage layer and the reference layer. Accordingly, in a MTJ element, a ferromagnetic layer having a large switching current for magnetization reversal is used as one ferromagnetic layer (the reference layer), and a ferromagnetic layer having a smaller switching current than the ferromagnetic layer serving as the reference layer is used as the other ferromagnetic layer (the storage layer). In this manner, a MTJ element including a ferromagnetic layer with a variable magnetization direction and a ferromagnetic layer with a fixed magnetization direction can be realized.

Figure 9:
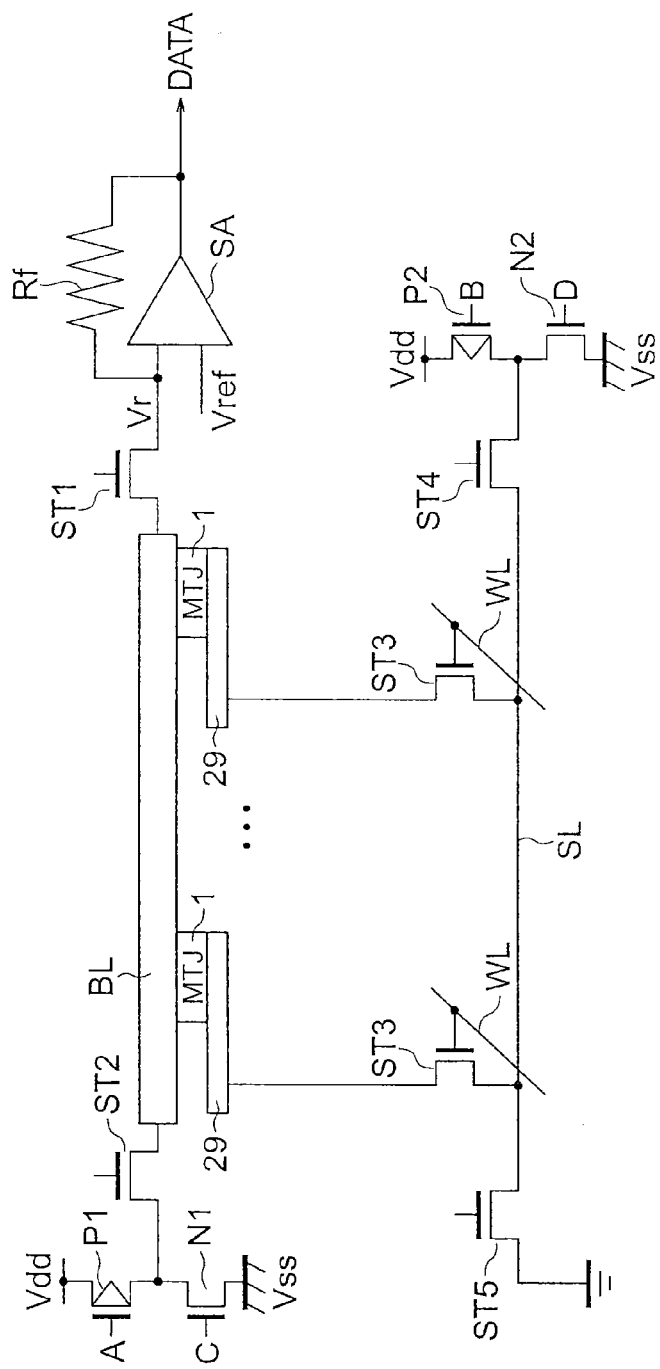
FIG. 9 is a circuit diagram of a magnetic memory according to a fifth embodiment.

FIG. 9 is a circuit diagram showing the structure of the MRAM according to the fourth embodiment. The MRAM of this embodiment includes memory cells arranged in a matrix fashion, and each of the memory cells includes the MTJ element 1. One end of each of the MTJ elements 1 is electrically connected to a bit line BL. One end of each bit line BL is electrically connected to a sense amplifier SA via an N-channel MOS transistor ST1 serving as a select switch. The sense amplifier SA compares a read potential Vr and a reference potential Vref supplied from a MTJ element 1, and outputs the result of the comparison as an output signal DATA. A resistor Rf electrically connected to the sense amplifier SA is a feedback resistor.

The other end of each bit line BL is electrically connected to the drain of a P-channel MOS transistor P1 and the drain of an N-channel MOS transistor N1 via an N-channel MOS transistor ST2 serving as a select switch. The source of the MOS transistor P1 is connected to a supply terminal Vdd, and the source of the MOS transistor N1 is connected to a ground terminal Vss.

The other end of each of the MTJ elements 1 is electrically connected to a lower electrode 29. Each of the lower electrodes 29 is electrically connected to a source line SL via an N-channel MOS transistor ST3 serving as a select switch. It should be noted that the source line SL extends in a direction parallel to the bit lines BL.

The source line SL is electrically connected to the drain of a P-channel MOS transistor P2 and the drain of an N-channel MOS transistor N2 via an N-channel MOS transistor ST4 serving as a select switch. The source of the MOS transistor P2 is connected to the supply terminal Vdd, and the source of the MOS transistor N2 is connected to the ground terminal Vss. The source line SL is also connected to the ground terminal Vss via an N-channel MOS transistor ST5 serving as a select switch.

The gate of each MOS transistor ST3 is electrically connected to a word line WL. Each word line WL extends in a direction perpendicular to the direction in which the bit lines BL extend.

Data writing into each MTJ element 1 is performed by a spin-injection writing technique. That is, the direction of the write current flowing in each MTJ element 1 is controlled by switching on and off the MOS transistors P1, P2, N1, and N2 with control signals A, B, C, and D, so as to realize data writing.

Data reading from each MTJ element 1 is performed by supplying a read current to the MTJ element 1. The read current is set at a smaller value than the write current. Each MTJ element 1 has a resistance value that varies depending on whether the magnetization directions of the reference layer and the storage layer are parallel or antiparallel, because of a magnetoresistive effect. That is, the resistance value of the MTJ element 1 becomes the smallest when the magnetization directions of the reference layer and the storage layer are parallel, and the resistance value of the MTJ element 1 becomes the largest when the magnetization directions of the reference layer and the storage layer are antiparallel. Such changes in resistance value are detected by the sense amplifier SA, to read the information recorded in the MTJ element 1.

Figure 10:
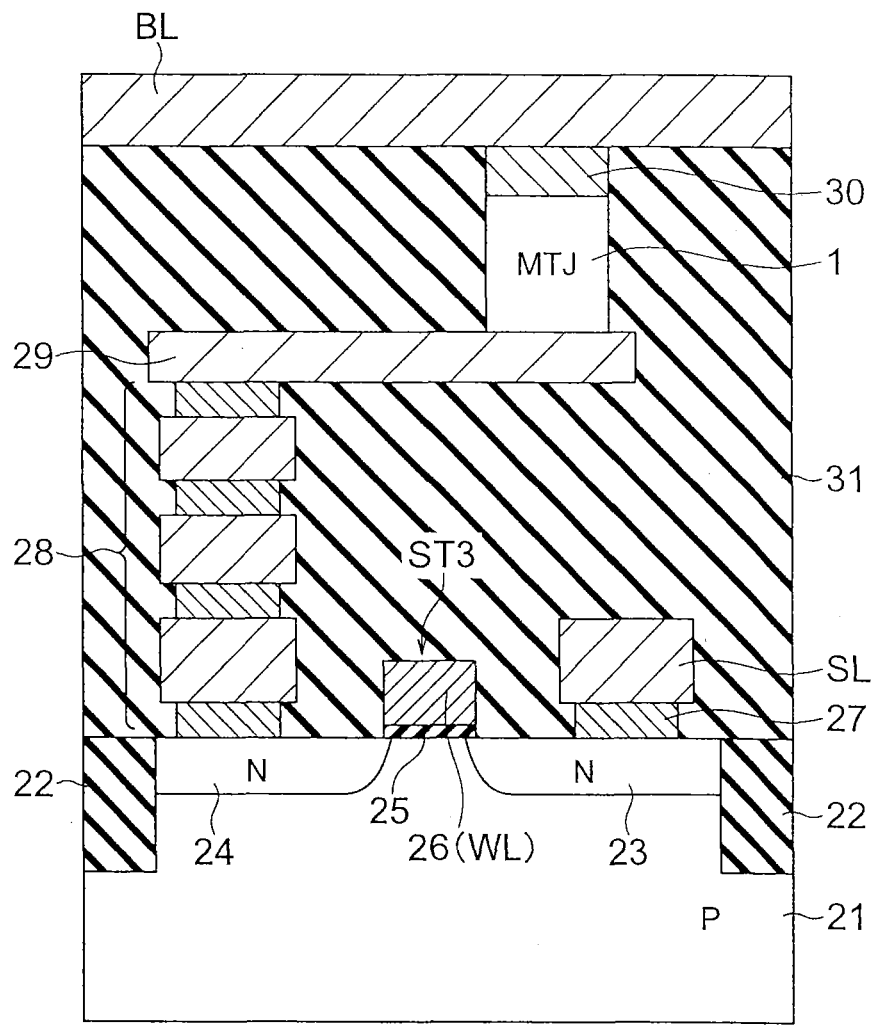
FIG. 10 is a cross-sectional view of a memory cell of the magnetic memory according to the fifth embodiment.

FIG. 10 is a cross-sectional view of one of the above described memory cells. An element isolation insulating layer 22 having a Shallow Trench Isolation (STI) structure is formed in a P-type semiconductor substrate 21. The N-channel MOS transistor ST3 as a select switch is formed in the element region (active region) surrounded by the element isolation insulating layer 22. The MOS transistor ST3 includes diffusion regions 23 and 24 serving as source/drain regions, a gate insulating film 25 formed on the channel region between the diffusion regions 23 and 24, and a gate electrode 26 formed on the gate insulating film 25. The gate electrode 26 is equivalent to the word line WL shown in FIG. 9.

A contact plug 27 is formed on the diffusion region 23. The source line SL is formed on the contact plug 27. A contact plug 28 is formed on the diffusion region 24. The lower electrode 29 is formed on the contact plug 28. The MTJ element 1 is provided on the lower electrode 29. An upper electrode 30 is formed on the MTJ element 1. The bit line BL is provided on the upper electrode 30. The space between the semiconductor substrate 21 and the bit line BL is filled with an interlayer insulating layer 31.

An example case where magnetoresistive elements according to one of the first through fourth embodiments and their modifications are used in a MRAM has been described so far. However, the magnetoresistive elements according to the first through fourth embodiments and their modifications can also be used in any other devices utilizing the TMR effect.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetoresistive element comprising:
   a first ferromagnetic layer having an axis of easy magnetization in a direction perpendicular to a film plane, a magnetization direction of the first ferromagnetic layer being changeable;
   a second ferromagnetic layer having an axis of easy magnetization in a direction perpendicular to the film plane, a magnetization direction of the second ferromagnetic layer being fixed;
   a first nonmagnetic layer provided between the first ferromagnetic layer and the second ferromagnetic layer; and
   a third ferromagnetic layer provided on an opposite side from the first nonmagnetic layer relative to the second ferromagnetic layer, and including a plurality of ferromagnetic oscillators generating rotating magnetic fields of different oscillation frequencies from one another, each of the oscillators having a magnetization parallel to the film plane,
   the rotating magnetic fields being generated by flowing a current between the first ferromagnetic layer and the third ferromagnetic layer and at least one of the rotating magnetic fields being applied at a magnetization switching in the first ferromagnetic layer.

2. The element according to claim 1, further comprising a spin injection layer injecting spin-polarized electrons into the third ferromagnetic layer, the spin injection layer being located between the second ferromagnetic layer and the third ferromagnetic layer.

3. The element according to claim 1, further comprising:
a spin injection layer injecting spin-polarized electrons into the third ferromagnetic layer, the spin injection layer being located on an opposite side from the second ferromagnetic layer relative to the third ferromagnetic layer; and
a second nonmagnetic layer provided between the second ferromagnetic layer and the third ferromagnetic layer.

4. The element according to claim 1, wherein the oscillation frequencies of the rotating magnetic fields generated from the oscillators of the third ferromagnetic layer are in the range of $0.62f_0$ to $1.50f_0$, where a resonant frequency of the first ferromagnetic layer is $f_0$.

5. The element according to claim 1, wherein the third ferromagnetic layer includes a nonmagnetic matrix and a plurality of ferromagnetic grains surrounded by the nonmagnetic matrix, the ferromagnetic grains being the oscillators.

6. The element according to claim 5, wherein
the nonmagnetic matrix of the third ferromagnetic layer is an oxide containing at least one element selected from Al, Si, Ti, Mg, Ta, Zn, Fe, Co, and Ni, and
the ferromagnetic grains contain at least one element selected from Fe, Co, and Ni.

7. The element according to claim 5, wherein
the nonmagnetic matrix of the third ferromagnetic layer is a nonmagnetic metal material, and
the ferromagnetic grains contain at least one element selected from Fe, Co, and Ni.

8. The element according to claim 1, wherein the third ferromagnetic layer comprises a ferromagnetic film and a nonmagnetic film, the ferromagnetic film containing at least one element selected from Fe, Co, and Ni, the nonmagnetic film containing at least one element selected from Cu, Ag, Au, and Ru.

9. The element according to claim 1, further comprising:
a fourth ferromagnetic layer provided between the second ferromagnetic layer and the third ferromagnetic layer, and having an axis of easy magnetization in a direction perpendicular to the film plane, a magnetization direction of the fourth ferromagnetic layer being antiparallel to the magnetization direction of the second ferromagnetic layer; and
a third nonmagnetic layer provided between the second ferromagnetic layer and the fourth ferromagnetic layer,
wherein $M_{S2}$ represents saturation magnetization of the second ferromagnetic layer, $t_2$ represents film thickness of the second ferromagnetic layer, $M_{S4}$ represents saturation magnetization of the fourth ferromagnetic layer, $t_4$ represents film thickness of the fourth ferromagnetic layer, and the relationship, $M_{S2} \times t_2 < M_{S4} \times t_4$, is satisfied.

10. A magnetic random access memory comprising:
the magnetoresistance effect element according to claim 1;
a first wire that is electrically connected to the first ferromagnetic layer; and
a second wire that is electrically connected to the third ferromagnetic layer.

11. The memory according to claim 1, further comprising a selective transistor, one of a source and a drain of which being electrically connected to one of the first and third ferromagnetic layers and the other of the source and the drain being electrically connected to one of the first and second wires.

* * * * *